United States Patent
Adam et al.

(10) Patent No.: US 6,183,612 B1
(45) Date of Patent: Feb. 6, 2001

(54) SPUTTERING CATHODE

(75) Inventors: Rolf Adam, Hanau; Jörg Krempel-Hesse, Eckartsborn; Martin Bähr, Haundorf-Gräfensteinberg, all of (DE)

(73) Assignee: Leybold Systems GmbH, Hanau (DE)

( * ) Notice: Under 35 U.S.C. 154(b), the term of this patent shall be extended for 0 days.

(21) Appl. No.: 09/179,398

(22) Filed: Oct. 27, 1998

(30) Foreign Application Priority Data

Oct. 30, 1997 (DE) .............................................. 197 47 923

(51) Int. Cl.[7] .................................................. C23C 14/34
(52) U.S. Cl. .............................. 204/298.12; 204/298.17; 204/298.19
(58) Field of Search ............... 204/298.12, 298.16, 204/298.17, 298.19, 192.12

(56) References Cited

U.S. PATENT DOCUMENTS

| | | | | |
|---|---|---|---|---|
| 4,198,283 | * | 4/1980 | Class et al. ............................ | 204/298 |
| 4,747,926 | * | 5/1988 | Shimizu et al. ....................... | 204/298 |
| 4,810,346 | * | 3/1989 | Wolf et al. ............................. | 204/298 |
| 4,865,708 | | 9/1989 | Weltry ................................... | 204/192 |
| 5,415,754 | * | 5/1995 | Manley ............................. | 204/192.12 |
| 5,863,399 | * | 1/1999 | Sichmann ......................... | 204/298.19 |
| 5,876,576 | * | 3/1999 | Fu ....................................... | 204/298.2 |

FOREIGN PATENT DOCUMENTS

| | | | |
|---|---|---|---|
| 3738845A1 | 5/1989 | (DE) ............................... | C23C/14/34 |
| 4237517A1 | 11/1994 | (DE) ............................... | C23C/14/34 |
| 296 10 720 U | 9/1996 | (DE) ............................... | C23C/14/22 |
| 196 14 487 | 10/1997 | (DE) ............................... | H01J/37/34 |
| 196 17 057 | 11/1997 | (DE) ............................... | H01J/37/34 |
| 196 22 606 | 12/1997 | (DE) ............................... | H01J/37/34 |
| 196 22 607 | 12/1997 | (DE) ............................... | H01J/37/34 |
| 95/12003 | 5/1995 | (WO) ............................. | C23C/14/34 |

OTHER PUBLICATIONS

English translation of DE 19622606, Dec. 1997.*
English translation of DE 19622607, Dec. 1997.*
English translation of DE 29610720, Sep. 1999.*
JP 6–184742 Abstract, Jul. 1994.*
JP 5–247637 Abstract, Sep. 1993.*

* cited by examiner

Primary Examiner—Nam Nguyen
Assistant Examiner—Steven H. Ver Steeg
(74) Attorney, Agent, or Firm—Smith, Gambrell & Russell, LLP

(57) ABSTRACT

A sputtering cathode with a flat plate-shaped target (8) and a tub-shaped yoke (3) arranged behind the target (8), with center ridge (5) and with magnets (7,7') for generating an enclosed tunnel of arc-shaped curved field lines (15,15') in front of the target surface, as well as with three sheet metal cutouts (9,10,11) or groups of partial cutouts inserted into the plane between the target (8) and the end faces (12) of the tub rim of the yoke (3) facing the target (8), all the sheet metal cutouts (9,10,11) together form two gaps (a,b) extending roughly parallel to the end faces (12,13), wherein the magnets (7,7') are each incorporated or inserted into the yoke bottom and the side surfaces of the magnets (7,7') facing towards and away from the target (8) run flush with the yoke bottom.

13 Claims, 2 Drawing Sheets

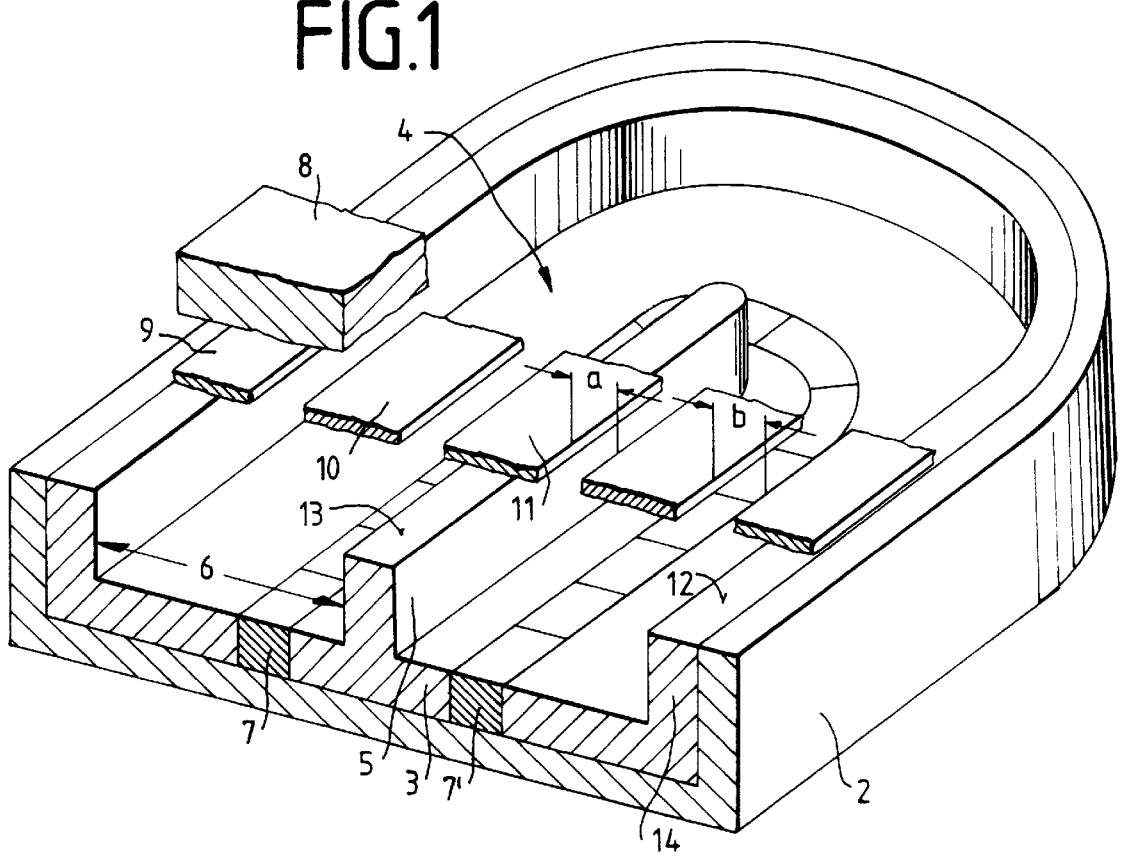
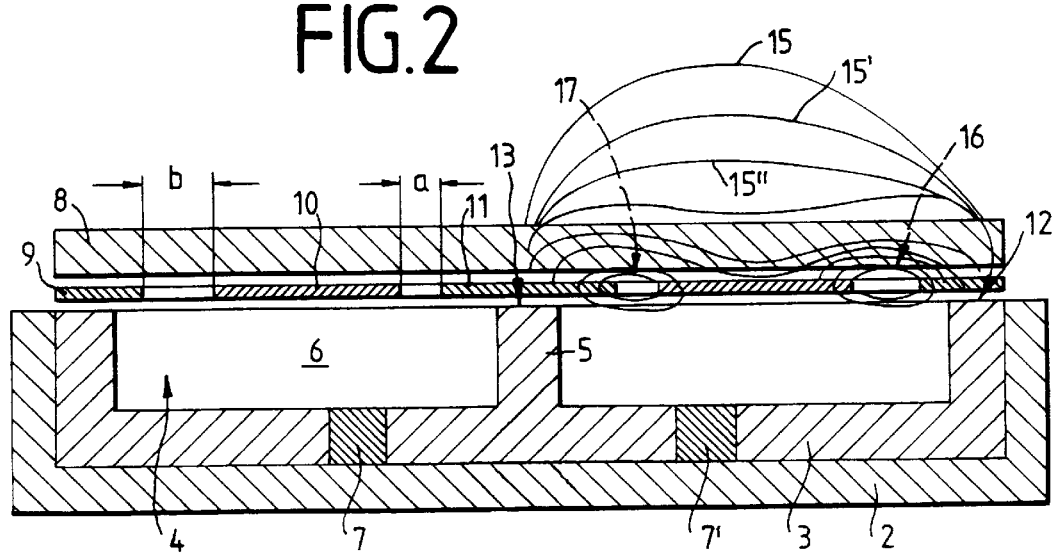

SPUTTERING CATHODE

INTRODUCTION AND BACKGROUND

The present invention pertains to a sputtering cathode with a flat plate-shaped target formed from at least one part and a tub-shaped yoke arranged behind the target with a center ridge and with magnets for generating an enclosed tunnel of arc-shaped curved field lines in front of the target surface, as well as with three sheet metal cutouts or groups of partial cutouts of magnetically conductive material inserted into the plane between the target and the end faces of the tub rim of the yoke, wherein two of these sheet metal cutouts or groups of partial cutouts cover the area above the end faces of the tub rim and the center ridge and the third sheet metal cutout or the third group covers a part of the area between the end face of the center ridge and the end face of the tub rim and all the sheet metal cutouts together form two gaps extending roughly parallel to the end faces.

A sputtering cathode is known from U.S. Pat. No. 4,865,708, in which segments of permeable material are arranged between the target, on the one hand, and the magnet yoke, on the other, in the plane of the magnet rows, more particularly, underneath the plane of the front magnetic surfaces facing the target, in order to divert the tunnel of curved field lines forming in front of the target into a concave shape, in order to permit a wider erosion trench on the target and thus a longer target service life.

Furthermore, a sputtering cathode has been proposed in DE 196 22 606.6, with a basic cathode element with a plate-shaped target as well as with a magnet yoke arranged behind the target, with two closed rows of magnets of different polarization arranged in an oval or rectangular configuration and mutually coaxial in a plane parallel to the target. In this known device the sheet metal cutouts or appropriately configured partial cutouts of magnetically conductive material are inserted into the plane between the target and the end faces of the magnets turned towards the target, wherein two of the sheet metal cutouts or partial cutouts have a frame-shaped configuration. The two respective arc-shaped sections of the sheet metal cutouts connecting the long straight parts have an edge profile departing from the circular, for instance, elliptical, parabolic or irregularly arc-shaped, so that the respective gaps formed by two adjacent arc-shaped sections have an irregular width profile.

In addition to that, a sputtering cathode has been proposed in DE 196 22 607.4 with a magnet yoke arranged behind the target, with two rows of magnets arranged in an oval or rectangular configuration in a plane parallel to the target, with three sheet metal cutouts or group of partial cutouts inserted into the plane between the target and the end faces of the magnets facing the target. Two of these sheet metal cutouts or groups of partial cutouts cover the area above the magnets and the third sheet metal cutout or the third partial cutout cover part of the area between the magnets. All the sheet metal cutouts together form two gaps extending essentially parallel to the rows of magnets.

Accordingly, an object of the present invention is to arrange the magnets such that, on the one hand, a flat and particularly wide erosion trench forms during the sputtering operation and as optimal a removal of material from the target as possible results and, on the other hand, the area between the magnetic tunnels extending in parallel is formed as narrowly as possible.

SUMMARY OF THE INVENTION

The above and other objects of the invention can be achieved according to the invention by inserting the magnets into the bottom of the yoke, in such a way that the side surfaces which face towards and the surface that face away from the target run flush with the top and bottom, respectively, of the yoke bottom.

BRIEF DESCRIPTION OF DRAWINGS

The present invention permits a broad variety of embodiments; one of these is illustrated in greater detail in the attached drawings, wherein:

FIG. 1 is a perspective view of one half of a cathode in accordance with the present invention, the target and the sheet metal cutouts being represented only as fragments;

FIG. 2 is a cross-sectional view through the cathode according to FIG. 1, in which a series of magnets are inserted into the bottom of the tub-shaped yoke;

DETAILED DESCRIPTION OF INVENTION

Figure 3:
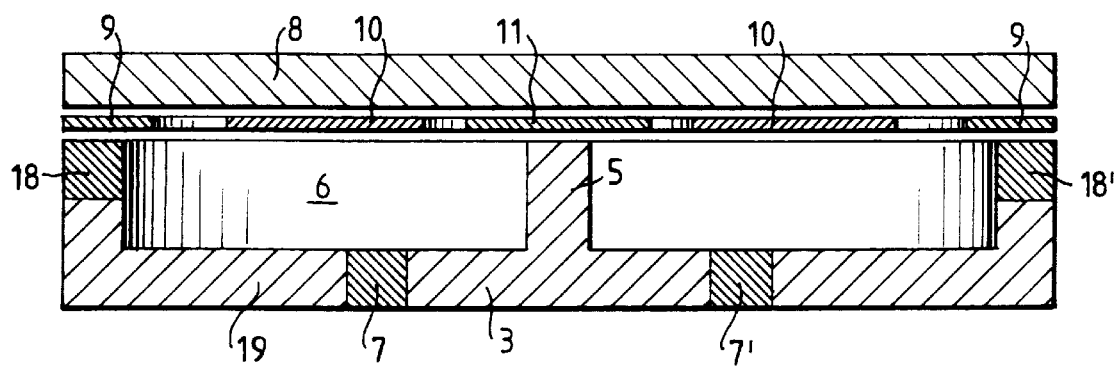
FIG. 3 is a cross-sectional view through a cathode in which, in contrast to the embodiment according to FIGS. 1 and 2, magnets are additionally arranged on the tub rim.

The sputtering cathode according to FIGS. 1 and 2 consists of a tub-shaped basic element 2, in which a likewise tub-shaped yoke 3 is inserted. The yoke has a ridge 5 dividing the depression 4 into two parts in the longitudinal direction and whose length is such that an oval cooling channel 6 is formed. A closed plurality of prism-shaped permanent magnets 7,7' are inserted into the bottom part of the yoke 3 such that their side surfaces facing towards the target and the side surfaces facing and away from the target 8 arranged above the yoke 3 run flush, respectively, with the bottom surface of the depression 4. The back surface of the yoke 3, and of 3 sheet metal cutouts 9,10,11 are inserted between the target 8 and the yoke 3, of which the two concentrically provided sheet metal cutouts 9 and 10 are constructed as oval rings and the central one as a strip-shaped sheet metal cutout 11 enclosed by the annular sheet metal cutouts 9, 10.

Above the magnet yoke 3 with its closed series of magnets 7, the target 8 is arranged, usually also equipped on its bottom side facing the series of magnets with a target base plate (not shown in detail). The sheet metal cutouts 9,10,11 inserted between the target base plate, on the one hand, and the magnets 7,7' on the other, can also be composed of several individual partial cutouts.

The three sheet metal cutouts 9,10,11 enclose two gaps "a" and "b" between themselves which can be dimensioned equally over their entire length or formed to narrow or widen over their length. Depending on the gap widths "a" and "b", the field lines 15,15',15" are diverted more or less strongly, so that a closed tunnel of field lines 15,15',15" is flattened and thus the sputtering rate is equalized overall and the target utilization is likewise improved.

Standard magnetron cathodes, consisting of a simple magnet arrangement (two series of magnets whose polarity is opposing) generally produce a sharply pointed sputtering trench. As a rule, this becomes narrower as it becomes deeper. An advantage of the invention resides in the fact that a magnetic field is formed that is different above the target surface and inside the target. The field above the target surface corresponds to that of the standard magnetron cathode. It runs approximately parallel to the target surface and escapes and enters on both sides of the target. A so-called roof field is created.

In contrast to conventional cathodes without sheet metal pieces inserted between target and yoke, a field is generated with the embodiment according to the invention in the target 8 that consists of two such roof fields 16,17. Thus the plasma on the target surface is divided into several partial plasmas side-by-side, whereby not only the center area of each half of the target is eroded to an increased extent, but also its boundary area, which leads to a considerable increase of the target utilization, since the sputtering trench thus turns out to be relatively wider.

For a structure of a sputtering cathode of the type in question, larger magnetic excitations are needed than for conventionally constructed sputtering cathodes, since a larger proportion of the magnetic flux is guided in the yoke and the sheet metal pieces and therefore not above the target surface. The entire flux density must thus be increased.

If the required magnets are positioned inside and outside (i.e., at the ridge and at the tub perimeter), the available space for the magnets is limited as a rule by the outer diameter; i.e., installed size. Only a limited volume, depending on geometrical conditions, can be used for the installation of the necessary magnet mass. Since the magnetic field distribution is defined, when the principle in question is used, essentially by the field exiting at the gaps, the actual position of the magnets here is relatively unimportant, however. Thus it is possible to integrate the magnets into the bottom of the magnetic yoke 3 without sharply changing the relative course of the field. In the bottom of the yoke 3, there is a relatively large amount of space for the installation of magnets. The magnets 7,7' are therefore installed horizontally into the yoke bottom.

An additional increase of the magnet mass can be produced by a combination of magnets, which are integrated into the yoke both horizontally and vertically or placed on top of it (see FIG. 3). In addition to the horizontal magnets built into the bottom, magnets 18,18' are placed on top of the peripheral rim of the yoke tub.

Since, in particular, no magnets are necessary on the rim 14 of the tub-shaped yoke 3 and on the center ridge 5 for the cathode according to the present invention, these areas can be formed particularly narrow, which leads to a better utilization of the target.

Figure 4:
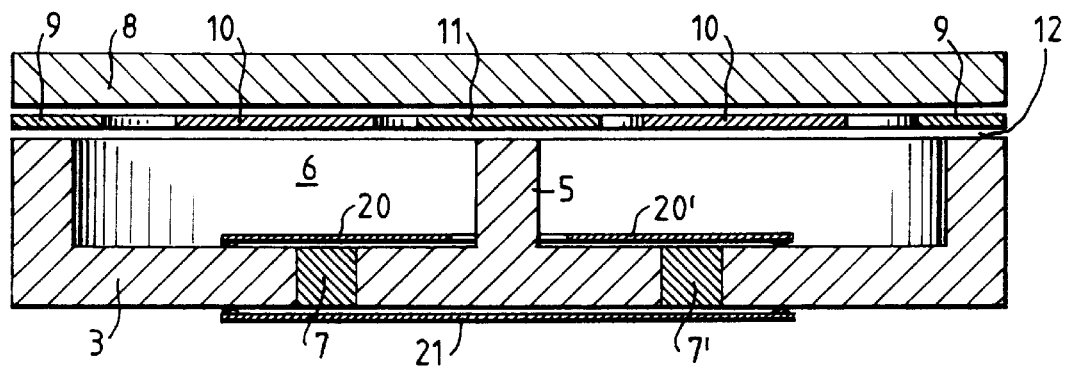
FIG. 4 is a cross-sectional view through a cathode as illustrated in FIGS. 1 and 2, but with additional covering sheets protecting the magnets against corrosion.

In addition, water cooling of the magnets can be better implemented in a cathode of the described type, without bringing the magnets themselves into contact with water (see FIG. 4). In order to protect the magnets 7,7' from the coolant flowing in the channel 6, the magnets 7,7' are covered with a sheet metal strip 20, 20' of a corrosion-resistant material forming a closed oval, the sheet metal strip 20,20' being glued, soldered or welded to the tub bottom 3. The outside surfaces of the magnets 7,7' are also covered by a sheet metal cutout 21 in the illustrated embodiment according to FIG. 4.

Further variations and modifications of the foregoing will be apparent to those skilled in the art and are intended to be encompassed by the claims appended hereto.

German priority application 197 47 923.5 is relied on and incorporated herein by reference.

We claim:

1. A sputtering cathode with a flat plate-shaped target formed from at least one part comprising a tub-shaped yoke having a center ridge and a tub rim with end faces and being spaced apart from and behind a target, a plurality of magnets set into said yoke for generating an enclosed tunnel of arc-shaped curved field lines in a front surface of the target having three sheet metal cutouts of magnetically conductive material inserted into a plane between the target and said end faces of the tub rim of the yoke facing the target, wherein two of the sheet metal cutouts cover an area above the end faces of the tub rim and the center ridge and the third sheet metal cutout, covers a part of an area between the end face of the center ridge and the end face of the tub rim, the sheet metal cutouts together forming two gaps extending essentially parallel to the end faces and the plurality of magnets are each incorporated or inserted into a bottom of the yoke, wherein side surfaces of the magnets facing towards and away from the target are flush with the yoke bottom.

2. The sputtering cathode according to claim 1, wherein the magnets inserted into the bottom part of the tub-shaped yoke are covered by a strip, where edges of the strip are fastened to the bottom surface of the yoke.

3. A sputtering cathode with a flat plate-shaped target formed from at least one part comprising a tub-shaped yoke having a center ridge and a tub rim with end faces and being spaced apart from and behind a target, a plurality of magnets set into said yoke for generating an enclosed tunnel of arc-shaped curved field lines in a front surface of the target, having three sheet metal cutouts of magnetically conductive material inserted into a plane between the target and said end faces of the tub rim of the yoke facing the target, wherein two of these sheet metal cutouts cover an area above the end faces of the tub rim and the center ridge and the third sheet metal cutout, covers a part of an area between the end face of the center ridge and the end face of the tub rim, the sheet metal cutouts together forming two gaps extending essentially parallel to the end faces and the plurality of magnets are each incorporated or inserted into a bottom of the yoke, wherein side surfaces of the magnets facing towards and away from the target are flush with the yoke bottom wherein said plurality of magnets are incorporated or inserted into the bottom of the yoke, an additional plurality of permanent magnets is arranged on said end face of a peripheral edge part of the tub-shaped yoke which faces the target, wherein a height of the edge part together with the magnets corresponds to a height of the center ridge.

4. A sputtering cathode with a flat target, comprising:
a tub-shaped yoke having a center ridge and a rim spaced from said target;
a plurality of magnets set into a bottom of said yoke to generate curved field lines in front of said target;
a plurality of metal cutouts of magnetically conductive material inserted between said target and said yoke and forming a plurality of gaps therebetween, said cutouts located above the center ridge, said rim and said magnets.

5. The sputtering cathode according to claim 4, wherein said magnets are set into said yoke flush with a surface of said yoke.

6. The sputtering cathode according to claim 4, wherein said magnets generate an enclosed tunnel of arc-shaped curved field lines in front of said target.

7. The sputtering cathode according to claim 4, wherein said cutouts are made of sheet metal.

8. The sputtering cathode according to claim 4, wherein said cutouts include groups of partial cutouts.

9. The sputtering cathode according to claim 4, wherein one of said cutouts is above said center ridge, a second of said cutouts is above said rim and a third of said cutouts lies between said center ridge and said rim and above said magnets.

10. The sputtering cathode according to claim 4, wherein said magnets are covered by metal strips.

11. The sputtering cathode according to claim 10, wherein strips are connected to said yoke by one of gluing, soldering or welding.

12. The sputtering cathode according to claim 4, wherein said magnets are cooled by water flowing in the yoke.

13. The sputtering cathode according to claim 4, wherein additional magnets are included in said rim.

* * * * *